(12) United States Patent
Kim et al.

(10) Patent No.: US 8,395,920 B2
(45) Date of Patent: Mar. 12, 2013

(54) CONTENT ADDRESSABLE MEMORY DESIGN

(75) Inventors: Young Seog Kim, Pleasanton, CA (US); Kuoyuan Hsu, San Jose, CA (US); Jacklyn Chang, San Ramon, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 363 days.

(21) Appl. No.: 12/788,924

(22) Filed: May 27, 2010

(65) Prior Publication Data

US 2010/0328982 A1 Dec. 30, 2010

Related U.S. Application Data

(60) Provisional application No. 61/221,877, filed on Jun. 30, 2009.

(51) Int. Cl.
*G11C 15/00* (2006.01)
(52) U.S. Cl. .......... 365/49.1; 365/49.17; 365/49.18; 365/189.08

(58) Field of Classification Search ............... 365/49.1, 365/49.17, 49.18, 189.08
See application file for complete search history.

(56) References Cited

U.S. PATENT DOCUMENTS 5,964,857 A * 10/1999 Srinivasan et al. ............ 710/244

* cited by examiner

*Primary Examiner* — Thong Q Le
(74) *Attorney, Agent, or Firm* — Lowe Hauptman Ham & Berner, LLP (57) ABSTRACT

A static CAM includes a plurality of entries E each including a number of CAM cells B and a summary S. Each CAM cell B is associated with a memory cell M and a comparator C. Generally, the CAM receives as input i number of lookup data lines. When data is received, memory cells M provide compared data for corresponding comparators C in CAM cells B to compare the compared data to the received data. If all compared data match all received data lines for an entry, then there is a hit for that entry. But if any compared data does not match the corresponding data line, then there is a miss for that line and therefore a miss for that entry. Depending on applications, the CAM returns an address if there is a hit for one or a plurality of entries.

22 Claims, 14 Drawing Sheets

CONTENT ADDRESSABLE MEMORY DESIGN

CROSS-REFERENCE TO RELATED APPLICATIONS

The present application claims priority of U.S. Provisional Patent Application Ser. No. 61/221,877 filed on Jun. 30, 2009 which is incorporated herein by reference in its entirety.

TECHNICAL FIELD

The present disclosure generally relates to CAM (Content-Addressable Memory) design.

BACKGROUND

Generally, a CAM is designed such that a user supplies a data bus (e.g., lookup data) comprising various data lines and the CAM searches a table with entries to determine if all data lines of the data bus match all compared lines of the entry related to the data bus in the table. If all data lines match all compared lines of the entry then there is a "hit," and the CAM returns the address of the matched entry. If any one of the data lines does not match any one of the compared lines, then it is a "miss," and the CAM does not return any address. Various CAM cell design approaches include a match line and transistors each associated with a compared line. If all data lines are hit, the match line stays at its original level (e.g., high). If, however, there is a miss in any of the data lines, the transistor associated with the miss line discharges the match line, e.g., pulling it toward ground. Since there is discharging, there is also charging. Because discharging and charging the match line is dynamic, those CAMs are commonly referred to as dynamic CAMs. Dynamic CAMs are usually slow, can produce noise, cause timing problems at high frequency and/or require additional circuitry for asynchronous applications. Many dynamic CAMs also require clocking circuitry for the match pre-charge, compare operations, data lookups, etc. Lookup data and match line pre-charge require high power, and a match line of dynamic CAMs can cause current leakages, sensing difficult, and weak capacitive coupling with a neighboring match line, etc.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

Like reference symbols in the various drawings indicate like elements.

DETAILED DESCRIPTION

Various embodiments, or examples, of the disclosure illustrated in the drawings are now described using specific language. It will nevertheless be understood that no limitation of the scope of the invention is thereby intended. Any alterations and modifications in the described embodiments, and any further applications of principles of the disclosure described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

Content Addressable Memory

Figure 1:
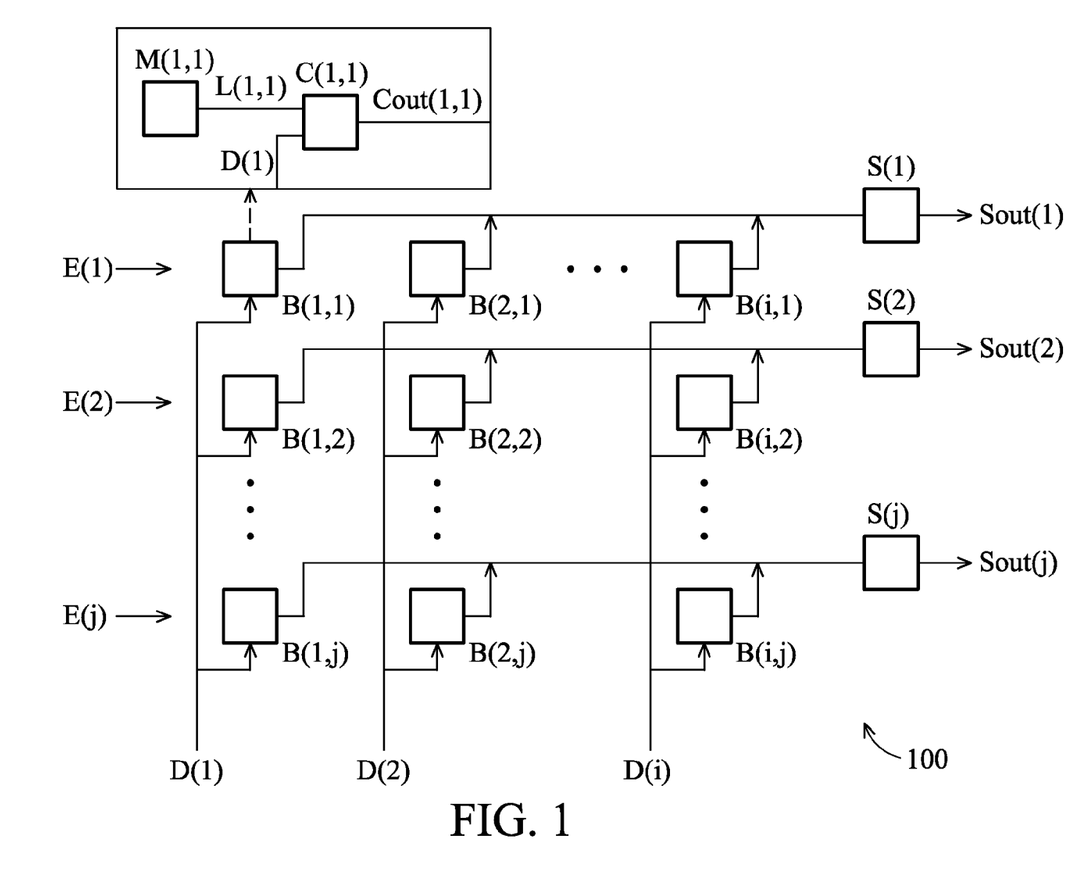
FIG. 1 shows a CAM in accordance with an embodiment of the disclosure.

FIG. 1 shows a CAM 100 in accordance with an embodiment of the disclosure. For illustration purposes, circuit 100 includes j entries E each including i number of CAM cells B. Each CAM cell B is associated with a memory cell M and a comparator C. For simplicity, detail of only CAM cell B(1,1) is shown, but other CAM cells B include similar components as those of CAM cell B(1,1). The output Cout of a comparator C also serves as an output of a CAM cell B.

Depending on implementation, a memory cell M in a CAM cell B could be different types of memory, including, for example, an SRAM (static Random Access memory), a DRAM (dynamic RAM), a flash RAM, a PRAM (phase RAM), an RRAM (register RAM), etc.

CAM 100 receives as input a number i of lookup data lines (e.g., lines D1 to D(i)), which may be referred to as a data bus. Each data line D associated with an entry E is associated with a CAM cell B. When data on the data lines (e.g., data lines D(1) to D(i)) is received comparators C compare data in memory cells M to the received data D. For an example related to entry E(1), each comparator C(1,1) to C(i,1) compares the corresponding data in memory cells M(1,1) to M(i,1) to the received data D(1) to D(i). For an example with respect to CAM cell B(1,1), comparator C(1,1) compares the data in memory cell M(1,1) to data D(1). In an embodiment, if the data in memory cell M(1,1) is the same as data D(1) then comparator C(1,1) returns a hit (e.g., high) on line Cout(1,1), and if the data in memory cell M(1,1) differs from data D(1) then comparator C(1,1) returns a miss (e.g., a low) on line Cout(1,1). With respect to CAM cell B(2,1), comparator C(2,1) compares the data in memory cell M(2,1) to data D(2). If the data in memory cell M(2,1) is the same as data D(2) then comparator C(2,1) returns a hit on line Cout(2,1), and if the data in memory cell M(2,1) differs from data D(2), then comparator C(2,1) returns a miss on line Cout(2,1). With respect to CAM cell B(i,1), comparator C(i,1) compares the data in memory cell M(i,1) to data D(i). If the data in memory cell M(i,1) is the same as data D(i) then comparator C(i,1) returns a hit on line Cout(i,1), and if the data in memory cell M(i,1) differs from data D(i) then comparator C(i,1) returns a miss on line Cout(i,1), etc. If all data in memory cells M(1,1) to M(i,1) is the same as data D(1) to D(i) associated with an entry E (e.g., entry E(1)) then there is a hit associated with that entry E(1). For example, if there is a hit in all CAM cells B(1,1) to B(i,1) (e.g., all lines Cout(1,1) to Cout(i,1) are hit), then summary S(1) returns a hit (e.g., low) on line Sout(1). If there is any miss (e.g., any low) in any CAM cell B(1,1) to CAM cell B(i,1), then summary S(1) returns a miss (e.g., high) on line Sout(1). Depending on implementations, CAM 100 returns an address if there is one or more hit entries.

Those skilled in the art will recognize that a summary S (e.g., summary S(1)) functions as a NAND gate because summary S(1) returns a low when all of its inputs are high and returns a high when at least one of its inputs is low. The above example is for illustration purposes only, a summary S may be implemented using various other compatible circuits, such as an AND, an OR, a NOR, and equivalences thereof. Further, those skilled in the art will also recognize that the output of an AND is an inverse of that of a NAND (e.g., an AND is a NAND with an inverter at the output of the NAND and vice versa). Additionally, summary S (e.g., summary S(1)) is implemented as a NAND to function with the active logic high at the output Cout of comparators C. That is, if there is hit, then Cout is high. If the logic level at Cout, however, is active low then a NOR may be implemented. For example, if all data at Cout(1,1) to C(i,1) is low (e.g., there is a hit), then Sout(1) is high, but if any one of Cout(1,1) to C(i,1) is high, then Sout(1) is low. Similarly to the NAND situation, an OR may be implemented in place of a NOR by adding an inverter at the output of the NOR gate. The above illustration related to entry E(1) is for illustration purposes only. The operation of other entries (e.g., entries E(2) to entry E(j)) is similar to that of entry E(1).

Summary Circuit for Cam—Transistor Level

Figure 2:
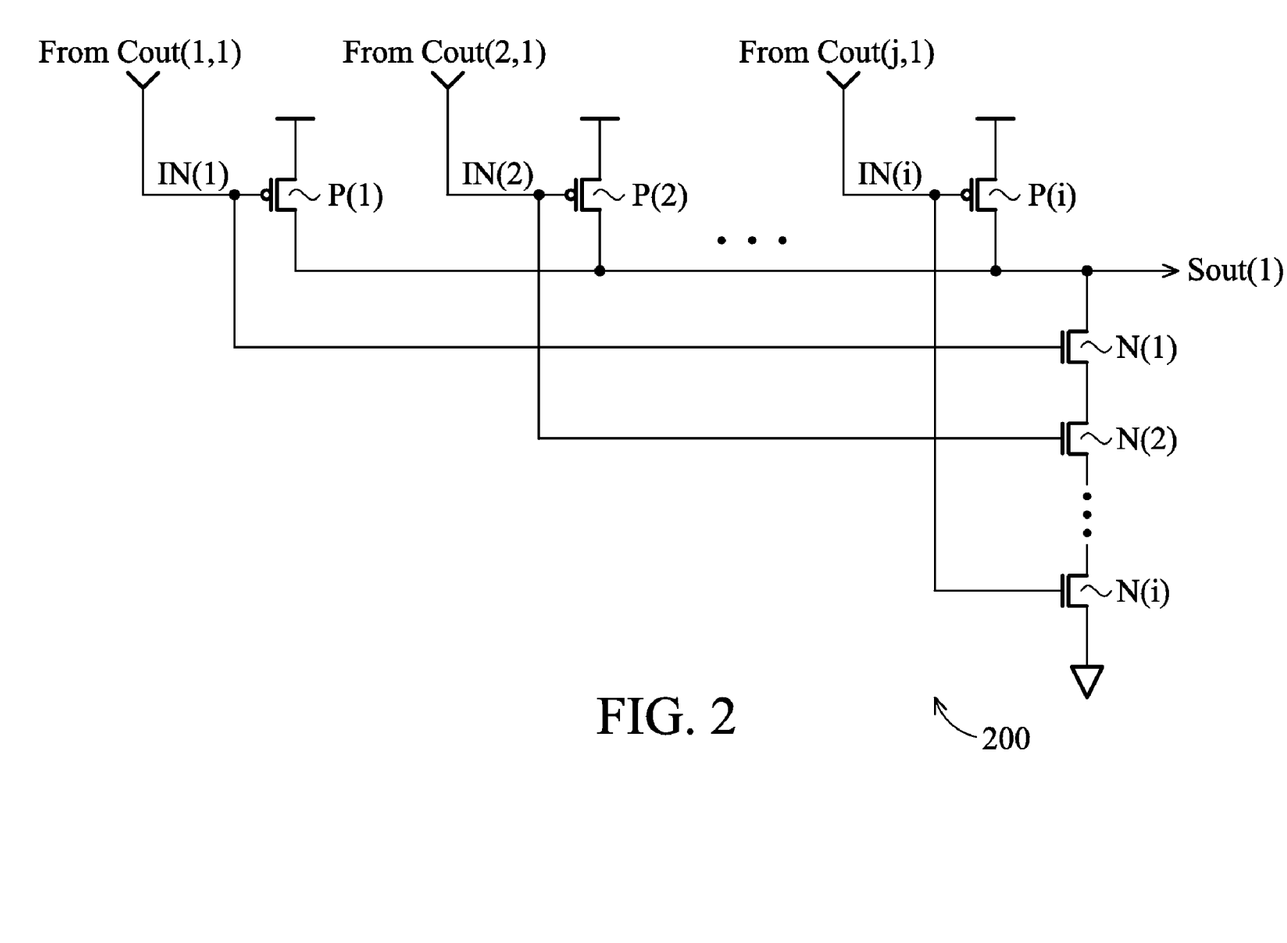
FIG. 2 shows a summary of the CAM in FIG. 1 implemented at the transistor level as a NAND gate in accordance with an embodiment.

FIG. 2 shows a circuit 200 illustrating an embodiment of a summary S, e.g., summary S(1), implemented in the transistor level as a NAND gate. Each input IN(1) to IN(i) corresponds to a pair of transistors P and N (e.g., transistors P(1) and N(1) to P(i) and N(i)), and receives a corresponding output of comparator C in FIG. 1 (e.g., output of comparator Cout(1,1) to Cout(i,1)). Output NANDout corresponds to an output Sout of FIG. 1 (e.g., Sout(1)).

Figure 3:
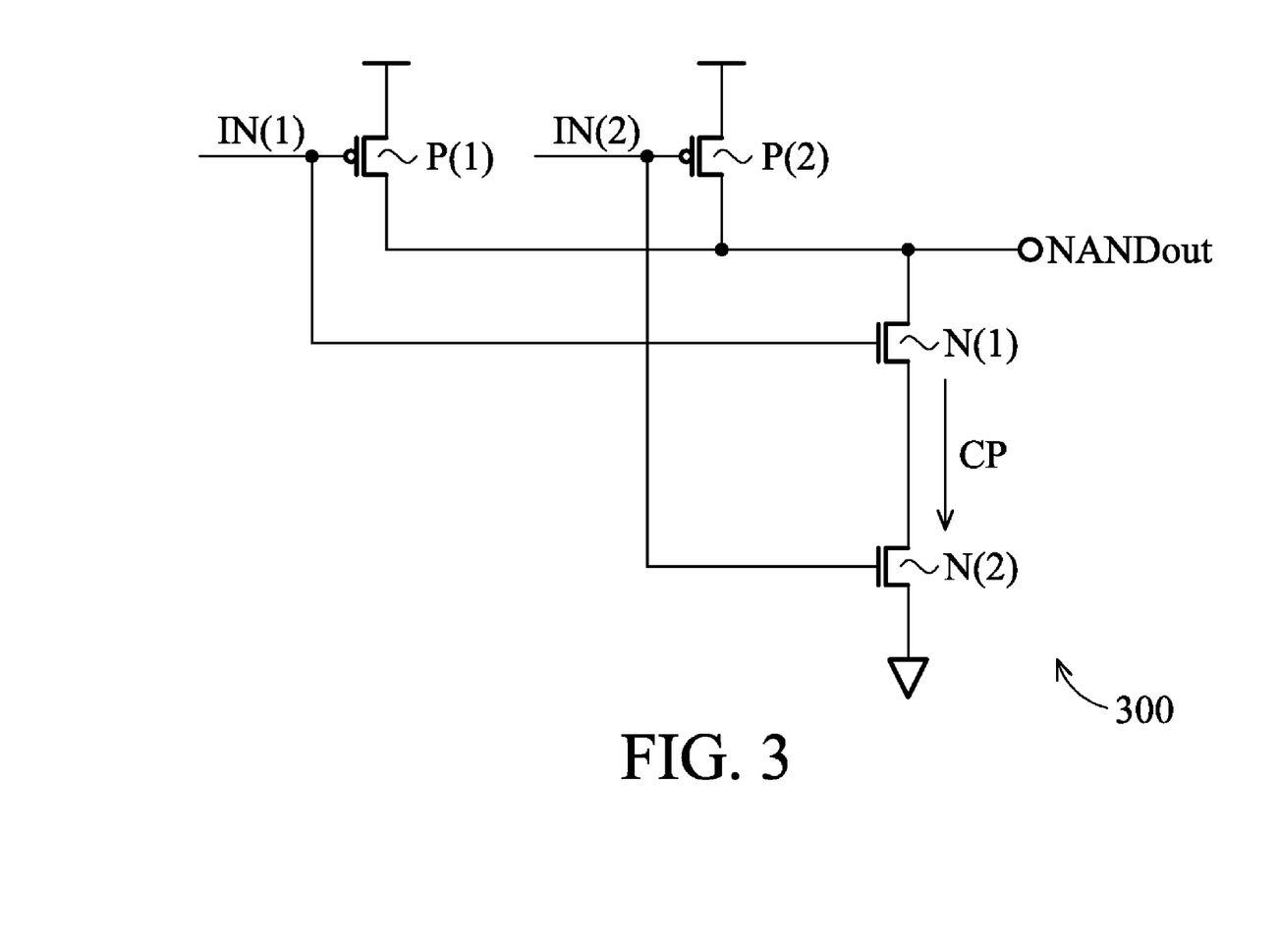
FIG. 3 shows the summary of FIG. 2 having only two inputs for illustration purposes.

For illustration purposes, circuit 200 is explained in the context of a two input NAND gate shown as circuit 300 in FIG. 3. If both inputs IN(1) and IN(2) are low then both transistors P(1) and P(2) are on and both transistors N(1) and N(2) are off. Because both transistors N(1) and N(2) are off, there is no current flowing through current path CP, and output NANDout is therefore high through Vdd of both transistors P(1) and P(2). If input IN(1) is low and input IN(2) is high, then transistor P(1) is on and transistor N(1) is off, and transistor P(2) is off and transistor N(2) is on. Because transistor N(1) is off, there is no current flowing through current path CP, and output NANDout is therefore high through Vdd of transistor P(1). If input IN(2) is low and input IN(1) is high, then transistor P(2) is on and transistor N(2) is off, and transistor P(1) is off and transistor N(1) is on. Because transistor N(2) is off, there is no current flowing through current path CP, and output NANDout is therefore high through Vdd of transistor P(2). If both inputs IN(1) and IN(2) are high then both transistors P(1) and P(2) are off and both transistors N(1) and N(2) are on. Because both transistors P(1) and P(2) are off, output NANDout is low through ground of transistor N(2). Output NANDout, going through an inverter known in the art, will provide an AND function.

Figure 4:
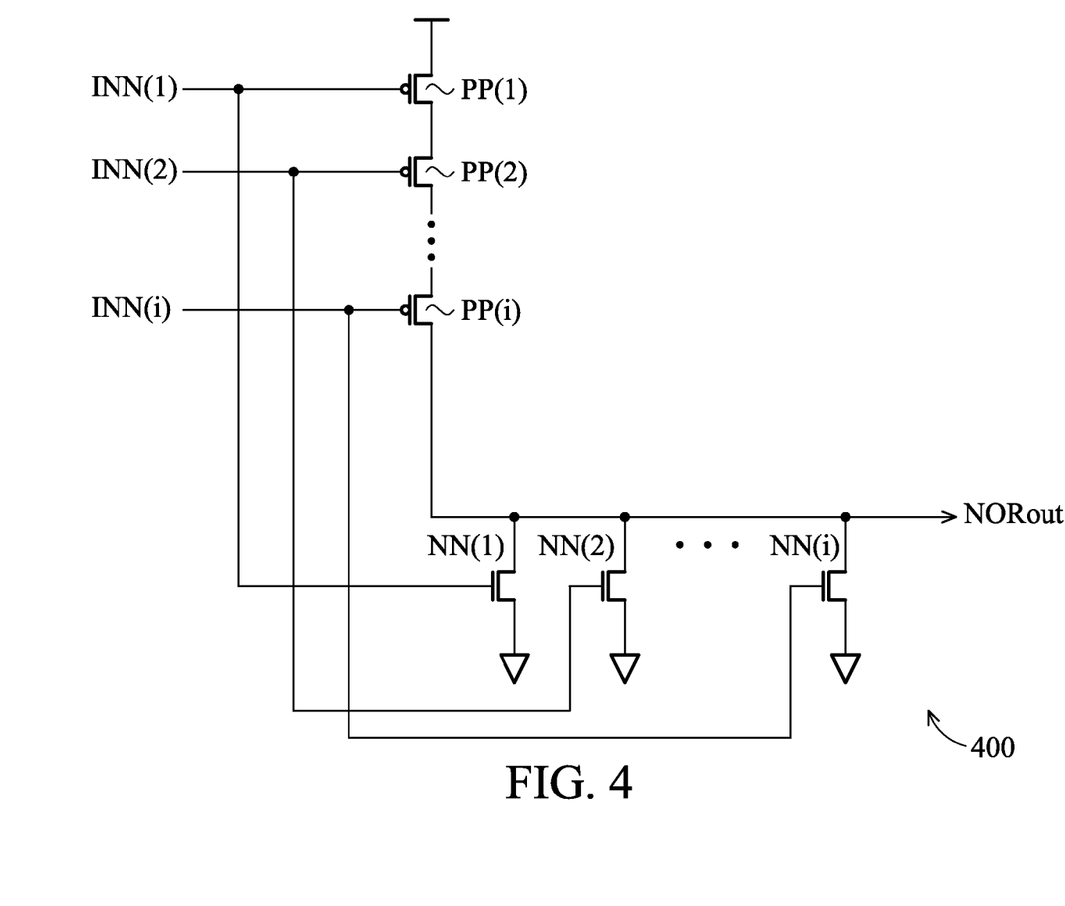
FIG. 4 shows a summary of the CAM in FIG. 1 implemented at the transistor level as a NOR gate in accordance with an embodiment.

FIG. 4 shows a circuit 400 illustrating an embodiment of a summary S, e.g., summary S(1), implemented in the transistor level as a NOR gate. Each input INN(1) to INN(i) corresponds to a pair of transistors PP and PN (e.g., transistors PP(1) and NN(1) to PP(i) and NN(i)), and receives a corresponding output of comparator C in FIG. 1 (e.g., comparator Cout(1,1) to Cout(i,1)). Output NORout corresponds to an output Sout of FIG. 1 (e.g., Sout(1)).

Figure 5:
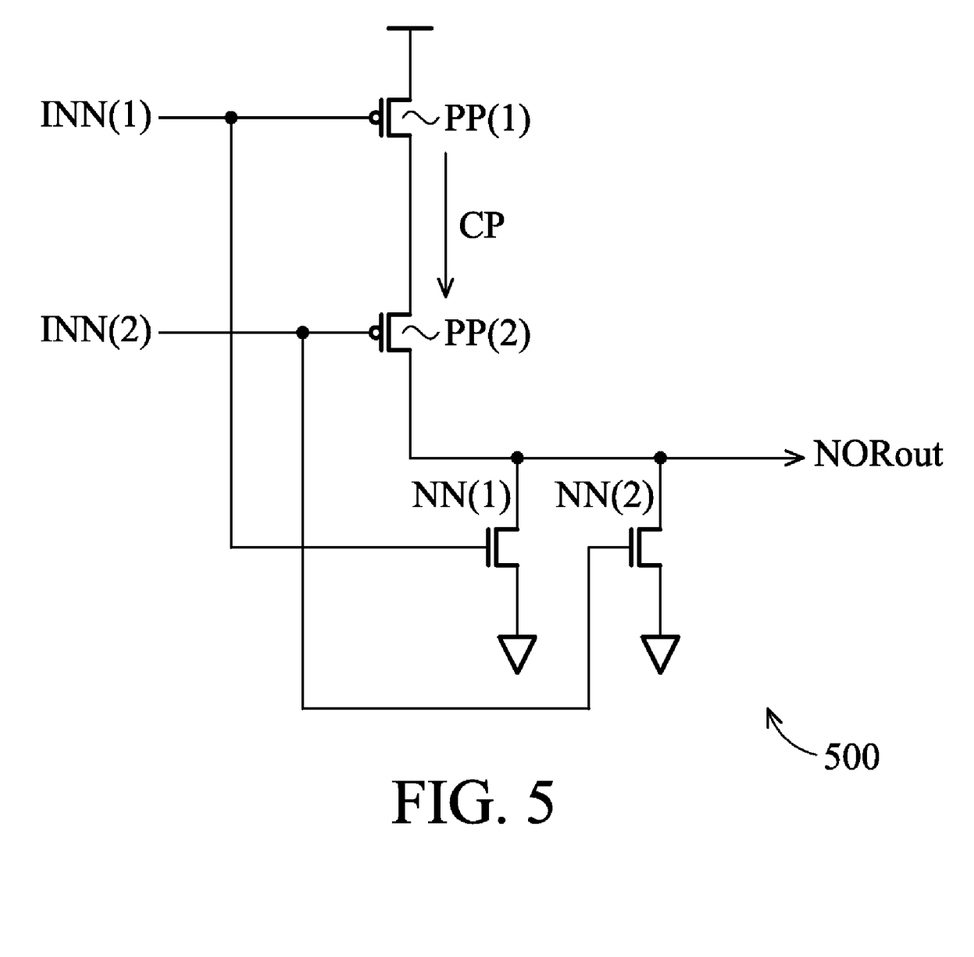
FIG. 5 shows the summary of FIG. 4 having only two inputs for illustration purposes.

For illustration purposes, circuit 400 is explained in the context of a two input NOR gate shown in FIG. 5. If both inputs INN(1) and INN(2) are low then both transistors PP(1) and PP(2) are on and both transistors NN(1) and NN(2) are off. Because both transistors PP(1) and PP(2) are on, current flows through current path CP, and output NORout is therefore high through Vdd of transistor PP(1). If input INN(1) is low and input INN(2) is high, then transistor PP(1) is on and transistor NN(1) is off, and transistor PP(2) is off and transistor NN(1) is on. Because transistor PP(1) is off, there is no current flowing through current path CP, and output NORout is therefore low through ground of transistor INN(1) and INN(2). If input INN(2) is low and input INN(1) is high, then transistor PP(2) is on and transistor NN(2) is off, and transistor PP(1) is off and transistor NN(1) is on. Because transistor PP(1) is off, there is no current flowing through current path CP, and output NORout is therefore low. If both inputs NN(1) and NN(2) are high then both transistors PP(1) and PP(2) are off and both transistors NN(1) and NN(2) are on. Because both transistors PP(1) and PP(2) are off, output NORout is therefore low. Output NORout, going through an inverter known in the art, will provide an OR function.

Summary Circuit For Cam—Combinatorial Circuits

Figure 6:
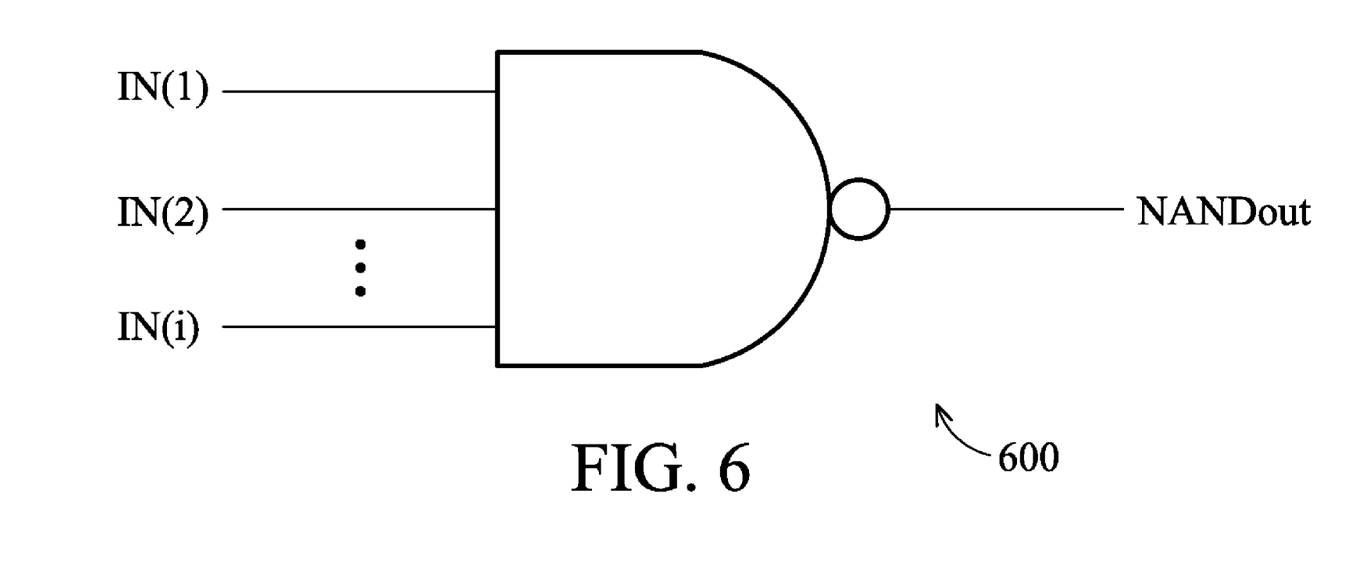
FIG. 6 shows a summary of the CAM in FIG. 1 as a NAND gate in accordance with an embodiment.

FIG. 6 shows an embodiment of a Summary S (e.g., summary S(1)) implemented as a NAND gate 600. NAND gate 600 includes i number of inputs IN(1) to IN(i) and an output NANDout. NAND gate 600 corresponds to circuit 200 in the transistor level.

In various embodiments of the disclosure, a data bus D received by CAM 100 can be quite large, i.e., there is a large number of data lines D(1) to D(i) or, alternatively expressed, index i is large, and there is a large number of lines Cout to be input into a summary S (e.g., summary S(1)). Depending on applications, embodiments of the disclosure use equivalent circuits to provide the function of NAND gate 600 or 200.

Figure 7:
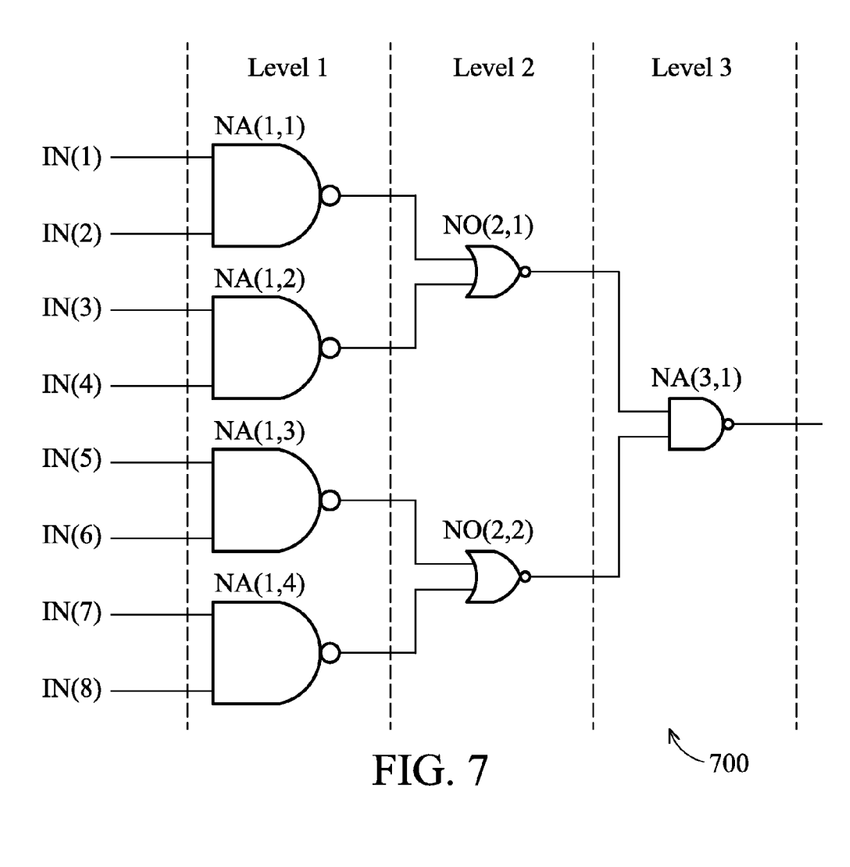
FIG. 7 shows the summary in FIG. 6 implemented in different levels of combinatorial circuitry in accordance with an embodiment having eight inputs.

FIG. 7 shows an embodiment of summary S(1) implemented as circuit 700 functioning as NAND gate 600. For illustration purposes, circuit 700 includes eight inputs (i.e., index i equals to eight). Circuit 700 includes a first level of four 2-input NAND gates, e.g., NAND gates NA(1,1), NA(1,2), NA(1,3), and NA(1,4), a second level of two 2-input NOR gates NOR (2,1) and NOR (2,2), and a third level of one 2-input NAND gate NA(3,1). Those skilled in the art will recognize that circuit 700 functions the same as circuit 600 having 8 inputs, the detail of which is not described here.

In various embodiments of the disclosure, if the number of data lines D increases, then the index i increases, and there are therefore additional inputs to a summary S. As a result, additional NAND gates (e.g., NAND gates NA(1, 5), NA(1, 6), etc.), at level one may be added to adapt to such increase. If such NAND gates are added, then NOR gates (e.g., NO(2,1), NO(2,2), etc.) at level two may receive additional inputs. For example, in FIG. 7, each of NOR gates NO(2,1), NO(2,2) receives two inputs from NAND gates in level one (NA(1,1), NA(1,2), NA(1,3), NA(1,4)), if additional NAND gates N(1, 5), NAND N(1, 6), etc., are added, then each NOR gates NO(2,1), NO(2,2) may be modified to receive two, three or more inputs. The number of inputs each NOR gate NO(2,1), NO(2,2) may receive depending on the number of NAND gates at level one that are added. Alternatively, additional NOR gates at level two (e.g., NOR gate NO(2,3), NO(2,4), etc.) may be added to adapt to the number of added NAND gates at level one. When the number of outputs of NOR gate (e.g., NO(2,1), NO(2,2)) increases, NAND gate NA(3,1) at level three may be modified to receive additional inputs.

Figure 8:
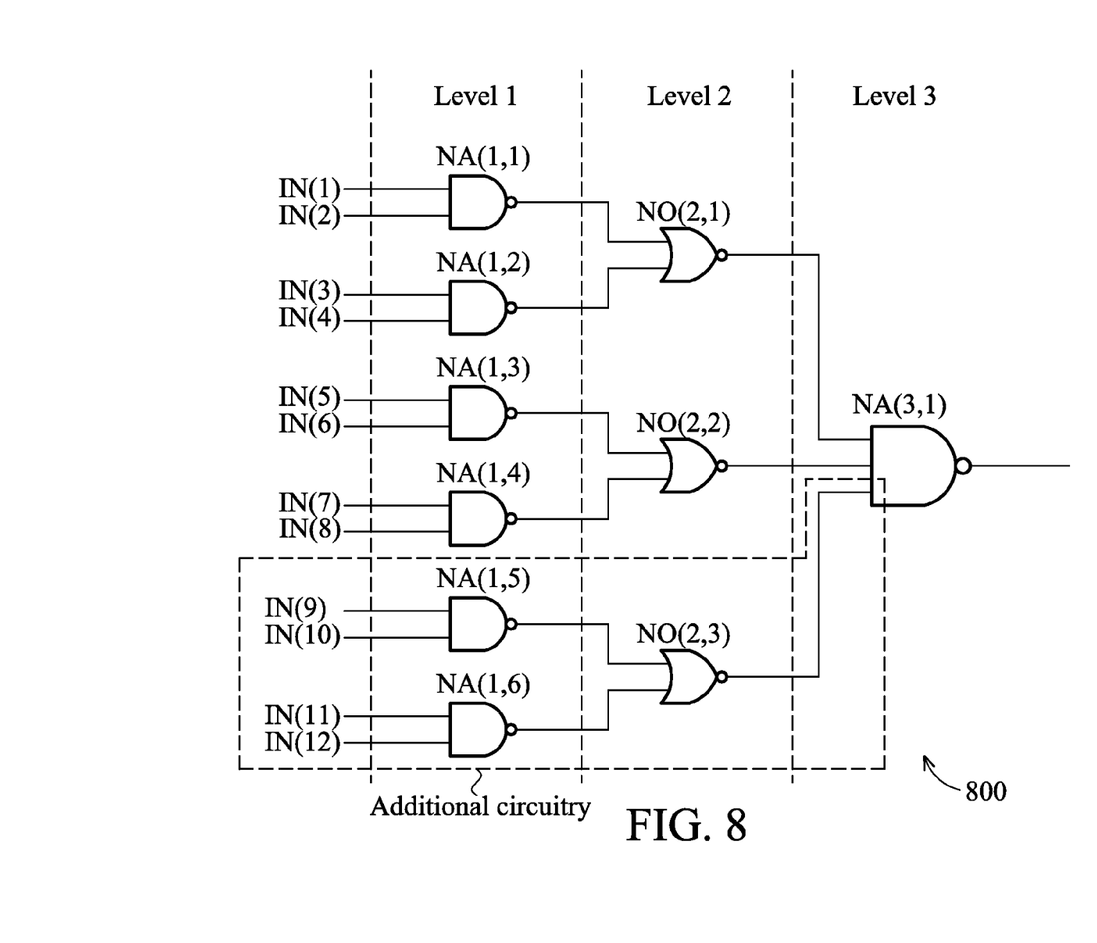
FIG. 8 shows the summary of FIG. 7 being modified to adapt to twelve inputs in accordance with an embodiment.

FIG. 8 shows a circuit 800 where index i of circuit 700 increases from eight to twelve. As a result, addition to circuit 700 includes four inputs IN(9) to IN(12), two NAND gates NA(1,5) and NA(1,6) at level one, one NOR gate NO(2,3) at level two. Further, NAND gate NA(3,1) at level 3 receives three instead of two inputs from the level two NOR gates.

Figure 9:
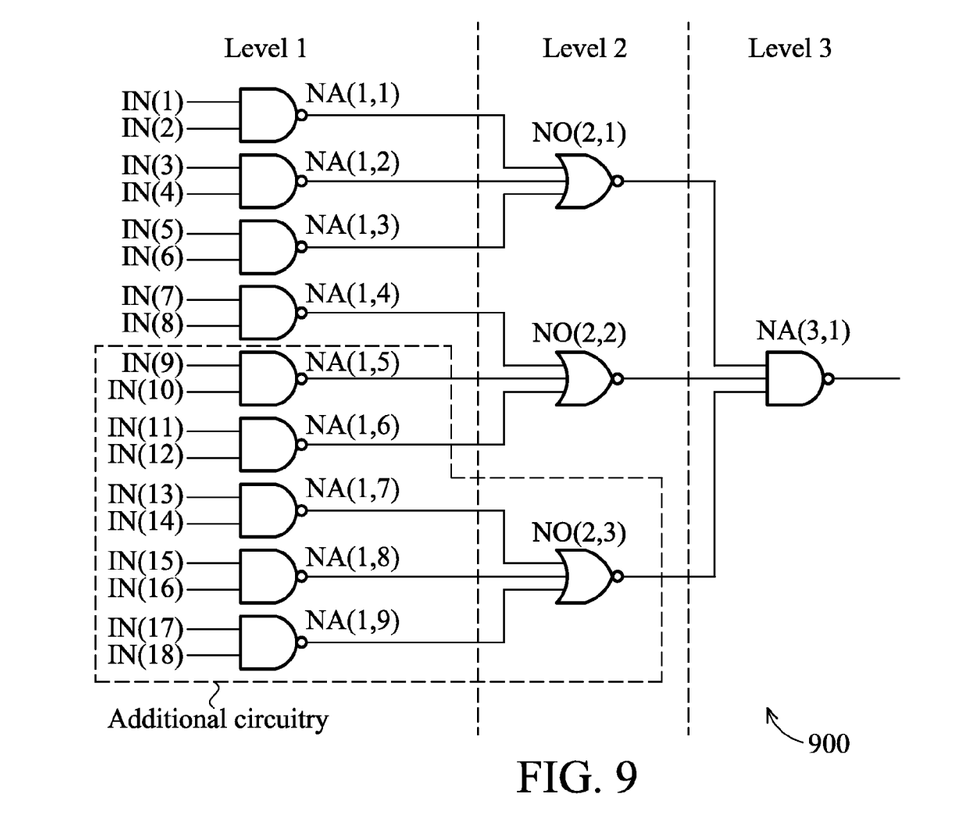
FIG. 9 shows the summary of FIG. 7 being modified to adapt to eighteen inputs in accordance with an embodiment.

FIG. 9 shows a circuit 900 where index i of circuit 700 increases from eight to eighteen. As a result, addition to circuit 800 includes ten inputs IN(9) to IN(18), one NOR gate NO(2,3) at level two. Further, NOR gates NO(2,1), NO(2,2) and the added NOR gate NO(2,3) each receives three inputs, instead of two. Additionally, NAND NA(3,1) at level three also receives three instead of two inputs from the level two NOR gates.

In various embodiments of the disclosure, when the number of outputs of NOR gates at level two increases, the number inputs of NAND gate NA(3,1) is increased to adapt to such increase of the NOR output. Depending on application, when this number of inputs is large to a point that NAND gate N(3,1) may be modified similar to the modification of summary S(1) as illustrated in FIGS. 6-9 to adapt to the increase in the number of inputs. That is, additional levels (e.g., level 4, level 5, level 6, etc.) may be added to circuits 700, 800, 900, etc., to perform the function of circuit 600. Adding levels (e.g., level 4, level 5, level 6, etc.) may be done similar to converting circuit 600 to circuits 700, 800, 900, etc. That is, converting a NAND gate with one level of logic gate to a NAND circuit with various levels of logic gates.

Figure 10:
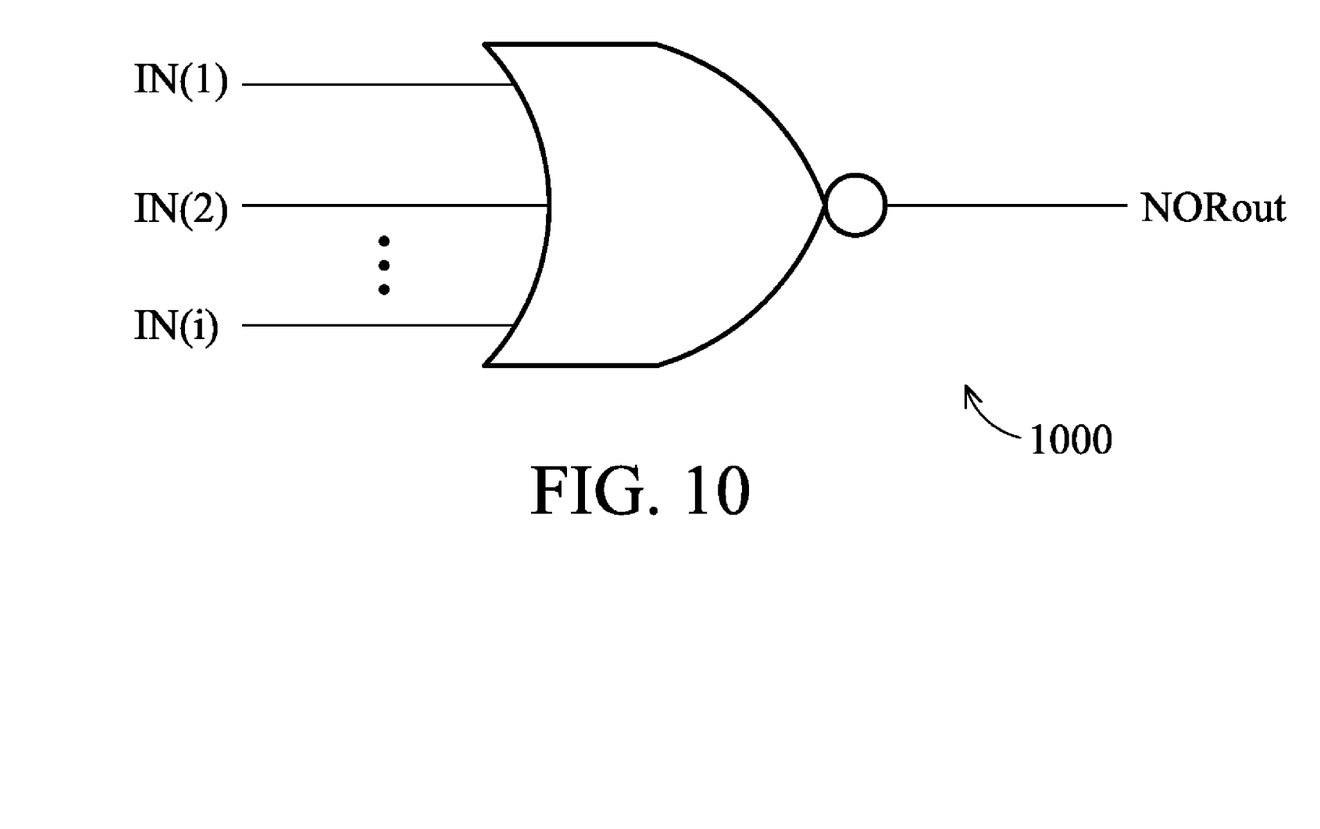
FIG. 10 shows a summary of the CAM in FIG. 1 as a NOR gate in accordance with an embodiment.
Figure 11:
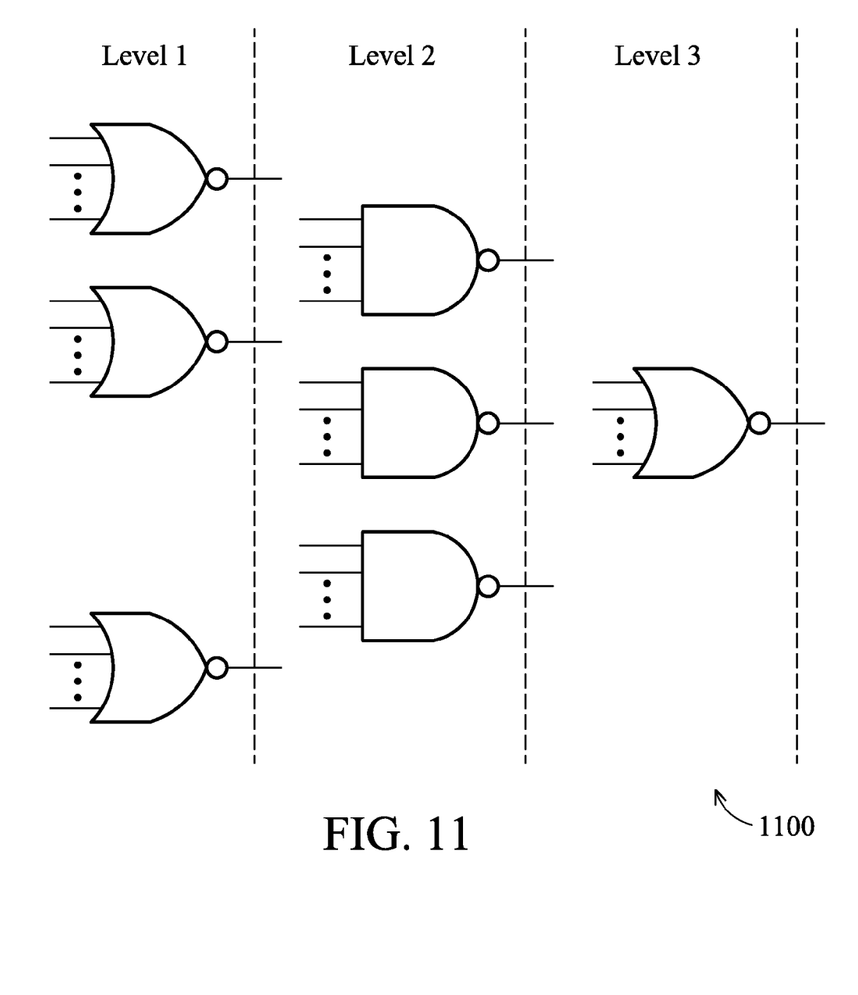
FIG. 11 shows the summary in FIG. 10 implemented in different levels of combinatorial circuitry in accordance with an embodiment.

FIG. 10 shows an embodiment of a Summary S (e.g., summary S(1)) implemented as a NOR gate 1000. NOR gate 1000 includes i number of inputs IN(1) to IN(i) and an output NORout, and corresponds to circuit 400 in the transistor level. FIG. 11 shows a NOR gate 1100 implemented with three levels of logic gates including a first level of NOR gate, a second level of NAND gate and a third level of NOR gate. The number of inputs to the logic gates in each level, the number of gates in each level, and the number of logic gate levels in NOR gate 1100 may vary in a manner similar to the NAND gate 600 as explained with respect to FIGS. 7, 8, and 9.

The Cam Cell—2$^{nd}$ Embodiment

Figure 12:
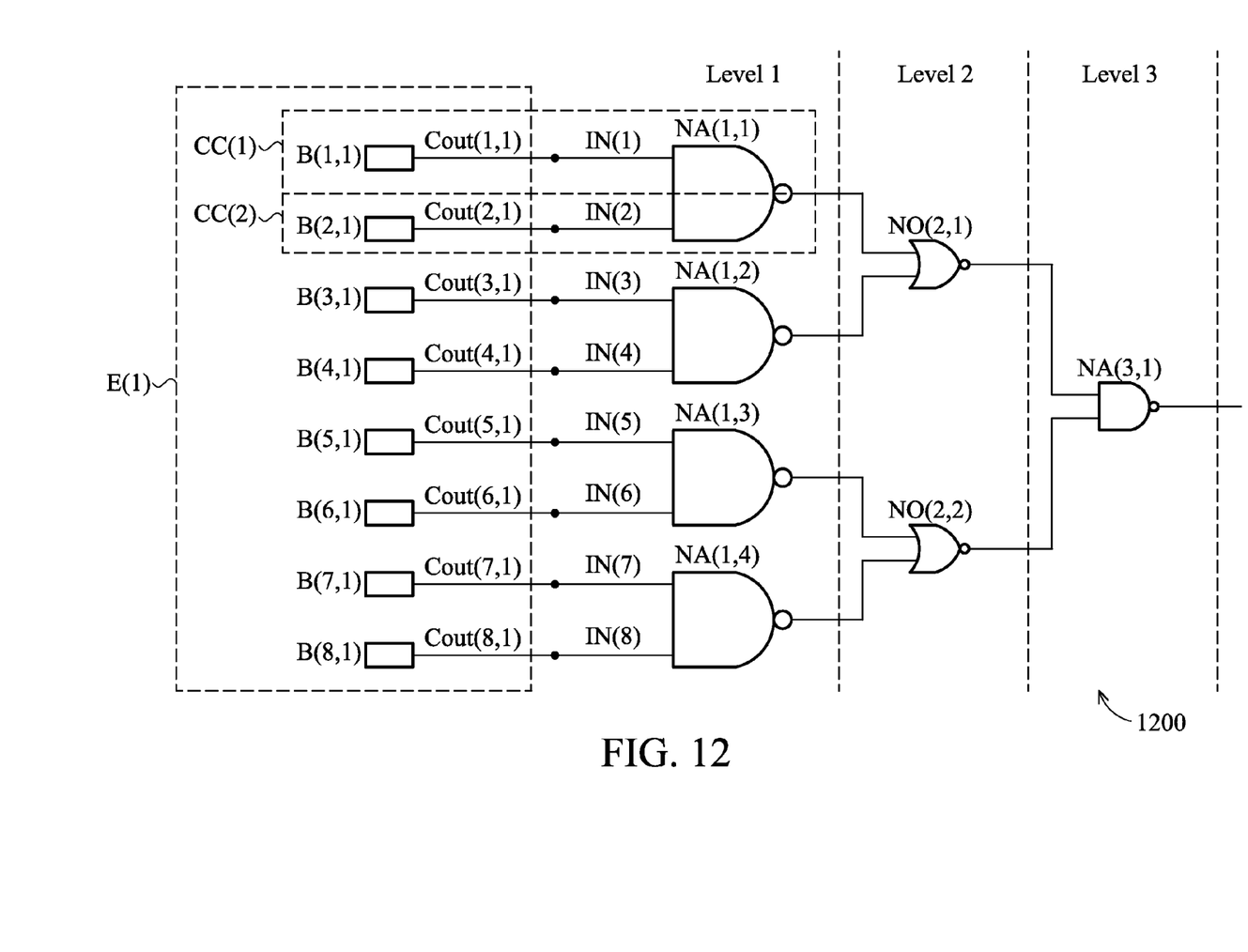
FIG. 12 shows a circuit to illustrate a second embodiment of CAM cells in accordance with an embodiment.

FIG. 12 shows a circuit 1200 illustrating CAM cells in accordance with a second embodiment of the disclosure. For illustration purposes, circuit 1200 shows an entry, e.g., entry E(1) associated with a data bus of eight data lines, e.g., data D(1) to D(8). In this embodiment, eight CAM cells B(1,1) to B(8,1) provide eight lines Cout(1,1) to Cout(8,1) to eight inputs IN(1) to IN(8) of a summary (e.g., summary S(1)) implemented as circuit 700. Further, a CAM cell B (e.g., B(1,1), B(2,1), B(3,1), etc.)) and half of the circuitry of a NAND gate in the first level (e.g., NAND NA(1,1), NA(1,2), NA(1,3), etc.) constitute a CAM cell CC. For simplicity, only two CAM cells CC(1) and CC(2) are shown. Further, if a NAND NA includes two N transistors and two P transistors as illustrated in FIG. 3, then a CAM cell CC (e.g., cell CC(1)) includes a CAM cell B (e.g., CAM cell B(1,1)) and circuitry associated with an N transistor (e.g., N(1)) and a P transistor (e.g., P(1)). Similarly, a CAM cell CC(2) includes a CAM cell B(2,1) and circuitry associated with N transistor N(2) and P transistor P(2), etc.

In various embodiments of the disclosure, a NAND NA in the first level receives two CAM cells CC, e.g., an odd CAM cell CC (e.g., CAM cells CC(1), CC(3), CC(5), etc.), and an even CAM cell CC (e.g., CAM cells CC(2), CC(4), CC(6), etc.) as inputs. For example, NAND NA(1,1) receives as inputs two CAM cells CC(1) and CC(2), NAND NA(1,2) receives as inputs two CAM cells CC(3) and CC(4), and NAND NA(1,3) receives as inputs two CAM cells CC(5) and CC(6), etc. FIG. 12 showing an eight input summary S is for illustration purposes only, if an entry E (e.g., E(1)) receives more than eight inputs, then each additional NAND in the first level (e.g., NAND NA(1,5), NA(1,6), NA(1,7), etc.) receives two additional CAM cells CC. Depending on applications, a NAND gate NA in the first level receiving two CAM cells CC as inputs provide consistency in terms of layout between output Cout of the comparator C and the NAND gate in the first level. It also provides efficient routing.

FIG. 12 shows a CAM cell CC including a CAM cell B and a half of the circuitry of a NAND NA for illustration purposes. If summary S(1,1) includes other gates (e.g., NOR gates) in the first level then a CAM cell CC includes a CAM cell B and half of the circuitry of that NOR gate.

Various embodiments of the disclosure are advantageous over other approaches because those approaches usually include a pre-charge circuit (e.g., transistor) to effect the voltage level of the match line (e.g., pulling down the match line level to ground) to determine whether there is a hit or a miss for an entry. Timing must be allocated for such discharges and corresponding charges. Further, in various situations, transistors for discharging and charging and transistors for the underlying inputs (e.g., data D) cannot be turned on at the same time. For example, one must be turned on after another one being turned off. Because various embodiments of the disclosure do not include pre-charge circuitry, timing for discharging and charging can be used for the underlying function of the circuit. The circuit can therefore operate at higher frequencies, and consequently perform its function in less time.

Layout Consideration

Various embodiments of the disclosure efficiently utilize layout slots as appropriate. For illustration purposes, a logic gate, e.g., a NAND in the first and third level, a NOR in the second and fourth level, etc., includes n number of inputs and one output. In various embodiments of the disclosure, where appropriate, n is selected to be odd (e.g., 1, 3, 5, etc.) so that the odd number of inputs n and the output constitute an even number. Alternatively expressed, where appropriate, various embodiments of the disclosure select a design such that a logic gate includes an even number of IO pins (input/output). By selecting the odd number of inputs (or an even number of input and output pins), layout slots in various embodiments of the disclosure are mostly used.

Figure 13:
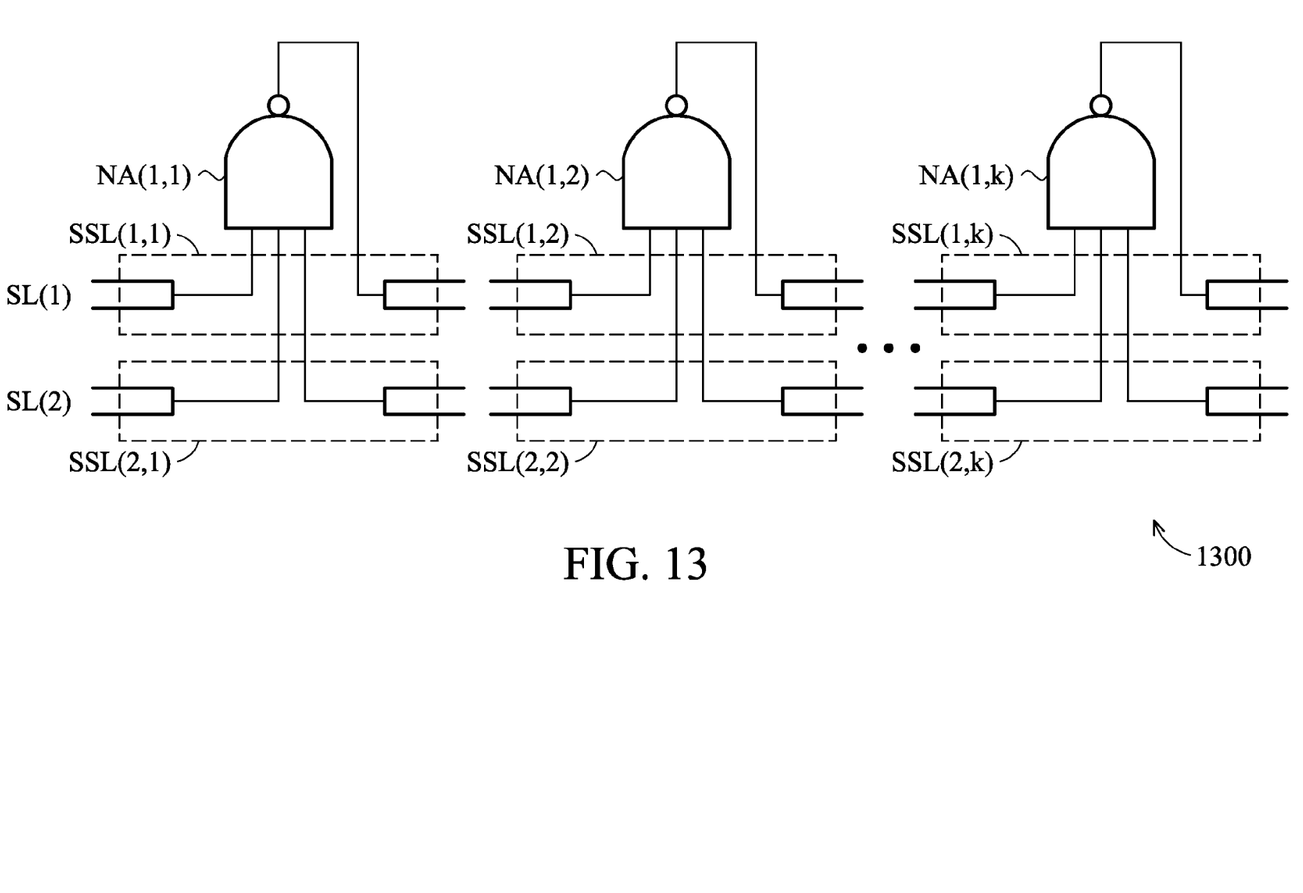
FIG. 13 shows an image to illustrate layouts in accordance with an embodiment.
Figure 14:
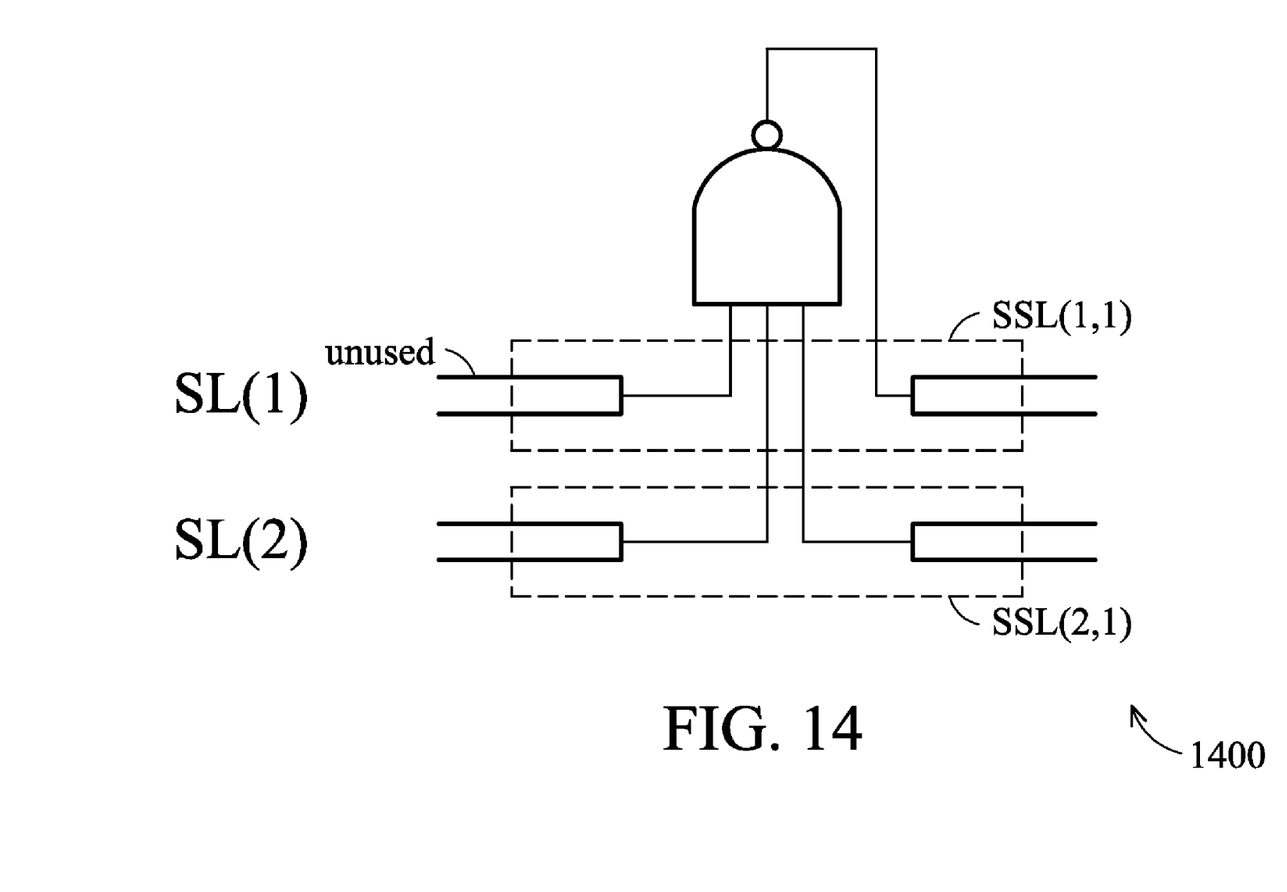
FIG. 14 shows an image to illustrate layouts disadvantaged over embodiments of the disclosure.

FIG. 13 shows an image 1300 in accordance with an embodiment of the disclosure. Image 1300 includes two slots SL(1) and SL(2). A slot SL includes a plurality of sub-slots each of which can adapt two pins, e.g., a pair of IO pins of a NAND NA. As a result, a NAND gate, e.g., NA(1,1) having four IO pins can utilize a sub slot SSL(1,1) of slot SL(1) and a sub slot SSL(2,1) of slot SSL(2). As shown, two inputs of each NAND gate NA use two pins of a same sub slot SSL of slot SL(1) while the third input and the output use two pins of the same sub slot SSL of SL(2). Because the number of IO pins of NAND NA is even, the layout slots are efficiently utilized. If the number of IO pins is odd, a sub slot SSL would not fully utilized. FIG. 14 shows a layout 1400 in which a NAND gate NA having two inputs and an output. The two inputs use a sub slot SSL(2,1) while output O uses a sub slot SSL(1,1). As shown, a portion of sub slot SSL(1,1) is unused and is therefore disadvantageous over various embodiments of the disclosure. Layout 1300 is shown to have two slots for illustration purposes only. Various embodiments of the disclosure are applicable with layouts having more than two slots SL. Additional slots SL are used for additional pins of the NAND NA. Generally, an additional slot SL is provided for each additional two IO pins of the NAND NA. For example, if a NAND NA includes six IO pins, then the additional two IO pins would use a sub slot of slot SL(3). If the NAND NA includes eight IO pins, then the additional four IO pins would use a sub slot of slot SL(3) and SL(4), etc.

A number of embodiments of the disclosure have been described. It will nevertheless be understood that various modifications may be made without departing from the spirit and scope of the invention. For example, various figures show a definite number for index i (e.g., i=2, FIG. 3; FIG. 5; i=8 FIG. 10; i=12, FIG. 8, etc.) for illustration purposes only, various embodiments of the disclosure are applicable with different values of index i when such index i operate to provide the functions consistent with the scope and spirit of the invention. FIGS. 7, 8, 9, 10, etc., show illustrative three levels of circuitry, but various embodiments are applicable with additional levels as long as the circuits with such additional levels can perform the equivalent functions of the underlying circuits and consistent with the spirit and scope of the invention. Some transistors are shown to be N-type and some others are shown to be P-type, but the disclosure is not limited to such a configuration because selecting a transistor type (e.g., NMOS or PMOS) is a matter of design choice based on need, convenience, etc. Various embodiments of the disclosure are applicable in variations and/or combinations of transistor types. Some signals are illustrated with a particular logic level to operate some transistors (e.g., activated high, deactivated low, etc.), but selecting such levels and the transistors are also a matter of design choice, and various embodiments of the disclosure are applicable in various design choices to maintain the spirit and scope of the invention as explained herein.

Each claim of this document constitutes a separate embodiment, and embodiments that combine different claims and/or different embodiments are within the scope of the disclosure and will be apparent to those of ordinary skill in the art after reviewing this document.

What is claimed is:

1. A content-addressable memory (CAM) comprising an entry including:
   a plurality of data lines;
   a plurality of CAM cells; each of the plurality of CAM cells comprising an output and adapted to output a logic state on the output; wherein the logic state on the output is based on a logic state of a respective data line associated with the respective CAM cell and data stored in the respective CAM cell; and
   a summary circuit having a plurality of inputs and an output; each of the plurality of inputs of the summary circuit adapted to receive the output of one of the plurality of CAM cells; the summary circuit adapted to output a logic state on the output of the summary circuit based on a logic state of the output of each of the plurality of CAM cells.

2. The content-addressable memory of claim 1 wherein each of the plurality of CAM cells includes a memory cell and a comparator; the memory cell storing the data in the respective CAM cell and the comparator providing the logic state of the output of the respective CAM cell.

3. The content-addressable memory of claim 1 wherein the summary circuit is selected from the group consisting of a NAND circuit, an AND circuit, a NOR circuit and an OR circuit.

4. The content-addressable memory of claim 1 wherein the summary circuit includes a plurality of levels of logic gates.

5. The content-addressable memory of claim 4 wherein each of the plurality of levels of logic gates is adapted to perform at least one function selected from the group consisting of a NAND function, an AND function, a NOR function and an OR function.

6. The content-addressable memory of claim 1 wherein the summary circuit includes a first level comprising a plurality of NAND gates, a second level comprising a plurality of NOR gates, and a third level comprising a NAND gate; each of the plurality of NOR gates in the second level adapted to receive, as inputs, outputs of one or more of the plurality of NAND gates in the first level; the third level NAND gate adapted to receive, as inputs, outputs of one or more of the plurality of NOR gates in the second level.

7. The content-addressable memory of claim 1 wherein the summary circuit includes a first level comprising a plurality of NOR gates, a second level comprising a plurality of NAND gates, and a third level comprising a NOR gate; each of the plurality of NAND gates in the second level adapted to receive, as inputs, outputs of one or more of the plurality of NOR gates in the first level; the third level NOR gate adapted to receive, as inputs, outputs of one or more of the plurality of NAND gates in the second level.

8. The content-addressable memory of claim 1 wherein a CAM cell and about a half of circuitry of a logic gate in the summary circuit constitute a cell.

9. The content-addressable memory of claim 1 wherein the logic state on the output of the summary circuit indicates whether the data on the data lines matches the data stored in the CAM cells of the entry or not.

10. The content-addressable memory of claim 9 wherein the output of the summary circuit is a single bit.

11. A content-addressable memory (CAM) comprising:
   a plurality of entries; each entry including a plurality of CAM cells and associated with a summary circuit; the summary circuit including a plurality of levels of logic gates and a plurality of inputs; each input receiving an output of one of the plurality of CAM cells; and
   a plurality of data lines; each one of the plurality of data lines associated with a respective one of the plurality of CAM cells of an entry; a logic state of an output of a respective CAM cell of the entry depending on a logic state of a respective data line and data stored in the respective CAM cell.

12. The content-addressable memory of claim 11 wherein the summary circuit is adapted to perform performs a function of at least one of a NAND function, an AND function, a NOR function or an OR function.

13. The content-addressable memory of claim 11 wherein the plurality of levels includes a first level comprising a plurality of NAND gates, a second level comprising a plurality of NOR gates, and a third level comprising a NAND gate.

14. The content-addressable memory of claim 11 wherein the plurality of levels includes a first level comprising a plurality of NOR gates, a second level comprising a plurality of NAND gates, and a third level comprising a NOR gate.

15. The content-addressable memory of claim 11 wherein a CAM cell of the plurality of CAM cells and about a half of circuitry of a logic gate in the summary circuit constitute a cell.

16. A content-addressable memory (CAM) comprising:
   a first CAM cell including a first memory adapted to store first data, a first comparator, and a substantially first half of circuitry of a logic gate being part of a summary circuit;
   a first data line; the first comparator adapted to receive as inputs the first data stored in the first memory and data on the first data line;
   a second CAM cell including a second memory adapted to store second data, a second comparator, and a substantially second half of the circuitry of the logic gate being part of the summary circuit; and
   a second data line; the second comparator adapted to receive as inputs the second data stored in the second memory and data on the second data line.

17. The content-addressable memory of claim 16 wherein the summary circuit includes a first level comprising a plurality of NAND gates, a second level comprising a plurality of NOR gates, and a third level comprising a NAND gate.

18. The content-addressable memory of claim 16 wherein the summary circuit includes a first level comprising a plurality of NOR gates, a second level comprising a plurality of NAND gates, and a third level comprising a plurality of NOR gates.

19. A method for designing a content-addressable memory, comprising:
   using an entry that includes a plurality of CAM cells and that is associated with a summary circuit; the summary circuit including a plurality of levels of logic gates and a plurality of inputs; each input receiving an output of a CAM cell; and
   selecting logic gates in a level of the summary circuit to have an odd number of input pins so that an input pin and an output pin share a layout sub-slot.

20. The method of claim 19 wherein the summary circuit includes a first level comprising a plurality of NAND gates followed by a second level comprising a plurality of NOR gates followed by a third level comprising a NAND gate.

21. The method of claim 19 wherein the summary circuit includes a first level comprising a plurality of NOR gates followed by a second level comprising a plurality of NAND gates followed by a third level comprising a NOR gate.

22. The method of claim 19 wherein the summary circuit performs at least a function of a NAND function, an AND function, a NOR function, or an OR function.

* * * * *